United States Patent
Edman et al.

[11] Patent Number: 5,667,851
[45] Date of Patent: Sep. 16, 1997

[54] PROCESS FOR PREPARING A METALLIZED POLYIMIDE FILM CONTAINING A HYDROCARBYL TIN COMPOUND

[75] Inventors: James R. Edman, Circleville, Ohio; Donald J. Coulman, Wilmington, Del.

[73] Assignee: E. I. Du Pont de Nemours and Company, Wilmington, Del.

[21] Appl. No.: 656,120

[22] Filed: May 30, 1996

Related U.S. Application Data

[62] Division of Ser. No. 236,793, Apr. 29, 1994, Pat. No. 5,543,222.

[51] Int. Cl.$^6$ .............................. H05H 1/00; C23C 14/00
[52] U.S. Cl. .............................. 205/95; 204/471; 204/486; 427/250; 427/255.7; 427/296; 427/301; 427/306; 427/316; 427/322; 427/404; 427/539; 427/573; 427/536; 205/158; 205/165; 205/186
[58] Field of Search .............................. 427/250, 301, 427/306, 316, 322, 404, 536, 539, 573, 255.7, 296; 204/471, 191.1

[56] References Cited

U.S. PATENT DOCUMENTS

| | | | |
|---|---|---|---|
| 5,130,192 | 7/1992 | Takabayashi et al. | 428/332 |
| 5,137,791 | 8/1992 | Swisher | 428/612 |
| 5,218,034 | 6/1993 | Milligan et al. | 524/399 |
| 5,272,194 | 12/1993 | Arduengo et al. | 524/177 |

FOREIGN PATENT DOCUMENTS

| | | |
|---|---|---|
| 0 476 575 | 3/1992 | European Pat. Off. . |
| 93/14157 | 7/1993 | WIPO . |

OTHER PUBLICATIONS

Macromolecules, vol. 17, 1984 Easton US, pp. 1627–1632, Ezzel et al., "Surface–Semiconductive Polyimide Films Containing Tin Complexes" (No Month Available).

*Primary Examiner*—Bernard Pianalto

[57] ABSTRACT

A vacuum metallized polyimide film comprising an aromatic polyimide layer containing a hydrocarbyl tin compound in oxidation states (II) or (IV) as an additive and a metal plated layer bonded integrally with a high bonding strength or high adhesion through a vacuum deposited metal layer without the use of an adhesive. The metallized polyimide film can be used for flexible printed circuits and multilayer printed wiring boards, as well as for heaters, antennas and antistatic films.

9 Claims, No Drawings

PROCESS FOR PREPARING A METALLIZED POLYIMIDE FILM CONTAINING A HYDROCARBYL TIN COMPOUND

This is a division of application Ser. No. 08/236,793, filed Apr. 29, 1994, U.S. Pat. No. 5,543,222.

BACKGROUND OF THE INVENTION

1. Field of the Invention

The present invention relates to a vacuum metallized polyimide film. More specifically, the invention relates to a vacuum metallized polyimide film comprising an aromatic polyimide layer and a metal layer bonded integrally, giving high bonding strength and high adhesion after exposure to temperature and humidity aging. The metal layer is formed without the aid of an adhesive by vacuum deposition of a thin metal layer followed by electroplating to the desired metal thickness. The metallized polyimide film can be utilized for various purposes, such as for flexible printed circuits and multilayer printed wiring boards, rigid-flex construction, and tape automated bonding, as well as for heaters, antennas and anti-static films.

2. Description of the Prior Art

Certain electronic assemblies have conductor traces on one or both sides of a dielectric substrate. Preferred dielectrics for applications requiring flexible substrates, especially in multilayer constructions, and tape automated bonding (TAB) involve the use of polyimide films. In general, the conductive layers on the polyimide film substrate are provided through the use of metal foils and adhesives especially formulated for their physical and thermal stability. The conductive layers are also provided, in some cases, through direct metallization by vacuum deposition or by electroless deposition methods well-known in the art.

The addition of small amounts of hydrocarbyl tin compounds and tin salts into the polyimide film has recently been disclosed in U.S. Pat. Nos. 5,218,034 and 5,272,194, as improving adhesion when the polyimide film is bonded to metal foils using an epoxy, acrylic or other heat-resistant adhesive. There is, however, no teaching or suggestion of the surprising and unexpected adhesion improvement after exposure to temperature humidity aging provided by a metallized polyimide film formed by directly bonding a polyimide film layer containing a hydrocarbyl tin compound to a metal vacuum deposited layer without the use of an adhesive, as specifically claimed herein.

The adhesive bonding method has certain disadvantages, especially in free line applications, multilayer applications, and applications requiring chemical milling, where either the properties of the adhesive or the physical space occupied by the adhesive are limiting factors. For example, adhesively bonded polyimide film-metal laminates can exhibit poor dimensional stability, a severe disadvantage for laying up multilayer boards; or limited resolution, a disadvantage in making fine line circuits.

A preferred construction, especially in multilayer applications and fine line circuits such as TAB, would avoid the use of adhesives altogether and provide the metal directly bonded to the polyimide film substrate. However, the durability of directly metallized polyimide film substrates also poses significant problems.

Two methods for preparing adhesiveless metal coated polyimide films are the related methods of evaporative and sputter deposition, followed by electrolytic copper buildup to obtain the desired thickness. Sputtering generally provides better adhesion than evaporative deposition, but clads made with both techniques exhibit significant loss of adhesion when exposed to temperature humidity aging.

In order to improve the adhesive strength between the aromatic polyimide film and the metal layer, as described above, attempts have been made to roughen the surface of the polyimide film, or to introduce reactive functional groups by a corona discharge or plasma treatment, or by a chemical surface treatment. Nevertheless, even when using such known methods, loss of adhesion occurs during temperature humidity aging. Thus, a need still exists for a metallized polyimide film, which eliminates the aforesaid disadvantages, and which has a high adhesive strength between the polyimide film layer and the vacuum deposited metal layer.

SUMMARY OF THE INVENTION

As hereinbefore set forth, the ability of a metal layer to retain an intimate bond to a polyimide film substrate after temperature humidity aging is a desirable feature in many electronic or electrical applications. By utilizing the method of the present invention, it has been found that a significant increase in the bonding properties may be obtained with a concomitant increase in the peel strength of a polyimide film directly bonded to a vacuum deposited metal layer. This increase, as will hereinafter be shown, is obtained by incorporation of specific hydrocarbyl tin compounds into the polyimide film.

In one aspect, an embodiment of this invention resides in a metallized polyimide film comprising (a) a polyimide film base layer containing a hydrocarbyl tin compound in oxidation states (II) or (IV), wherein the concentration of tin in said polyimide film ranges from 0.02 to 1% by weight, (b) a thin, vacuum deposited metal layer on at least one side of said polyimide film base layer, and (c) a metal plated layer applied onto said vacuum deposited metal layer, wherein said polyimide base layer is directly bonded to said vacuum deposited metal layer without the use of an adhesive.

Another embodiment of the invention resides in a process for preparing a metallized polyimide film, comprising the steps of:

(a) incorporating a hydrocarbyl tin compound in oxidation states (II) or (IV) into a solution of a poly(amic acid) precursor of a polyimide film;

(b) forming a solidified self-supporting film of said poly (amic acid) precursor;

(c) heating said solidified poly(amic acid) film at a temperature greater than 350° C. to completely imidize said poly(amic acid) to form said polyimide film, wherein the concentration of tin in said completely imidized polyimide film ranges from 0.02 to 1% by weight;

(d) forming a thin metal layer by vacuum deposition of a metal on at least one side of said polyimide film; and (e) applying a thick metal plated layer onto said vacuum deposited metal layer, wherein said polyimide base layer is directly bonded to said vacuum deposited metal layer without the use of an adhesive.

DETAILED DESCRIPTION OF THE INVENTION

The present invention relates to a metallized polyimide film having an improved bond strength after temperature humidity aging between the polyimide film layer and a metal layer formed by vacuum depositing a thin metal layer followed by electroplating to the desired metal thickness. It has been found that a metallized polyimide film having excellent adhesion properties after temperature humidity aging can be obtained by incorporation of a minor amount of a hydrocarbyl tin compound in oxidation states (II) or (IV) into the polyimide film layer, and then effecting a vacuum deposition of a metal onto the surface of the polyimide film containing the hydrocarbyl tin compound and, further, effecting a metal plating on the vacuum deposited metal layer to thereby accomplish the present invention.

According to the process of the present invention, a minor amount of a hydrocarbyl tin compound in oxidation states (II) or (IV) is added to a solution of a poly(amic acid) precursor in an organic solvent and the poly(amic acid) converted to the corresponding polyimide by heating at a temperature greater than 350° C.

The polyimide films used in this invention can be made generally as disclosed in U.S. Pat. Nos. 3,179,630 and 3,179,634, the disclosures of which are hereby incorporated by reference. The poly(amic acids) are made by dissolving substantially equimolar amounts of at least one aromatic tetracarboxylic dianhydride and at least one aromatic diamine in an organic solvent and agitating the resulting solution under controlled temperature conditions until polymerization of the dianhydride and the diamine is completed.

Suitable dianhydrides for use in the polyimide films include: pyromellitic dianhydride; 2,3,6,7-naphthalene tetracarboxylic dianhydride; 3,3',4,4'-biphenyl tetracarboxylic dianhydride; 1,2,5,6-naphthalene tetracarboxylic dianhydride; 2,2',3,3'-biphenyl tetracarboxylic dianhydride; 3,3',4,4'-benzophenone tetracarboxylic dianhydride; 2,2-bis(3,4-dicarboxyphenyl) propane dianhydride; 3,4,9,10-perylene tetracarboxylic dianhydride; 2,2-bis(3,4-dicarboxyphenyl) hexafluoropropane dianhydride; 1,1-bis(2,3-dicarboxyphenyl)ethane dianhydride; 1,1-bis(3,4-dicarboxyphenyl) ethane dianhydride; bis (2,3-dicarboxyphenyl)methane dianhydride; bis(3,4-dicarboxyphenyl)methane dianhydride; oxydiphthalic dianhydride, bis(3,4-dicarboxyphenyl)sulfone dianhydride; and the like.

Suitable aromatic diamines for use in the polyimide films include: 4,4'-diaminodiphenyl propane; 4,4'-diaminodiphenyl methane; benzidine; 3,4'-dichlorobenzidine; 4,4'-diaminodiphenyl sulfide; 3,4'-diaminodiphenyl sulfone; 4,4'-diaminodiphenyl sulfone; 4,4'-diaminodiphenyl ether; 3,4'-diaminodiphenyl ether; 1,5-diaminonaphthalene; 4,4'-diaminodiphenyldiethyl silane; 4,4'-diaminodiphenyl silane; 4,4'-diaminodiphenyl ethyl phosphine oxide; 4,4'-diaminodiphenyl N-methyl amine; 4,4'-diaminodiphenyl N-phenyl amine; 1,4-diamino benzene (p-phenylene diamine); 1,3-diamino benzene(m-phenylene diamine); 1,2-diaminobenzene(o-phenylene diamine); and the like.

The preferred polyimide film used in this invention is derived from 4,4'-diaminodiphenyl ether and pyromellitic dianhydride.

Copolyimide films derived from any of the above diamines and dianhydrides can also be used. Particularly preferred copolyimide films are those derived from 15 to 85 mole % of biphenyltetracarboxylic dianhydride, 15 to 85 mole % of pyromellitic dianhydride, 30 to 100 mole % of p-phenylene diamine and 0 to 70 mole % of 4,4'-diamino diphenyl ether. Such copolyimide films are described in U.S. Pat. No. 4,778,872, which disclosure is also incorporated herein by reference.

The organic solvent must dissolve one or both of the polymerizing reactants and, preferably, should dissolve the poly(amic acid) polymerization product. The solvent must be substantially unreactive with all of the polymerizing reactants and with the poly(amic acid) polymerization product.

Preferred organic solvents include normally liquid N,N-dialkylcarboxylamides, generally. Preferred solvents include the lower molecular weight members of such carboxylamides, particularly N,N-dimethylformamide and N,N-dimethylacetamide. Other solvents which may be used are dimethylsulfoxide, N-methyl-2-pyrrolidone, tetramethyl urea, dimethylsulfone, hexamethylphosphoramide, tetramethylene sulfone, and the like. The solvents can be used alone, in combinations with one another or in combinations with poor solvents such as benzene, benzonitrile, dioxane, and the like. The amount of solvent used preferably ranges from 75 to 90 weight % of the poly(amic acid) solution.

The poly(amic acid) solutions are generally made by dissolving the aromatic diamine in a dry solvent and slowly adding the aromatic tetracarboxylic dianhydride under conditions of agitation and controlled temperature in an inert atmosphere. The aromatic diamine is conveniently present as a 5 to 15 weight percent solution in the organic solvent and the aromatic diamine and aromatic tetracarboxylic dianhydride are usually used in about equimolar amounts.

A minor amount of hydrocarbyl tin (II) or tin (IV) compound is introduced, prior to the casting step, into the film-forming poly(amic acid) solution or while the polymerization of the poly(amic acid) is being performed.

The poly(amic acid) solution containing the organotin can be cast as either a partially cured "gel film" or a "solvated film". The term "gel film" used herein means a sheet of the poly(amic acid) polymer which is laden with volatiles, primarily organic solvent, to such an extent that the polymeric material is in a gel-swollen, plasticized, rubbery condition. The gel film thickness generally falls in the range of from 2 to 35 mils. The volatile content is usually in the range of 80 to 90% by weight of the gel film. The gel film is self-supporting and partially and incompletely cured, i.e., is at an intermediate stage of curing from the poly(amic acid) to the polyimide.

The gel film structure can be prepared by the chemical conversion process described in U.S. Pat. No. 3,410,826 by mixing a chemical converting agent and a tertiary amine, respectively, into the poly(amic acid) solution at a low temperature, followed by casting the poly(amic acid) solution in film form on a casting surface and then mildly heating at, for example, 100° C. to activate the conversion agent and catalyst for transforming the cast film to a poly(amic acid) polyimide gel film.

The gel film is subsequently dried to remove the water, residual organic solvent, and the remaining conversion chemicals, and the poly(amic acid) is completely converted to the polyimide. The drying can be conducted at relatively mild conditions without complete conversion of the poly (amic acid) to the polyimide at that time, or the drying and conversion can be conducted at the same time using higher temperatures. Because the gel film has so much liquid which must be removed during the drying and converting steps, it must be restrained during drying to avoid undesired shrinkage. In continuous production, the film can be held at the edges, such as in a tenter frame using tenter clips or pins for restraint.

Preferably, high temperatures are used for short times to dry the film and convert it to the polyimide in the same step. It is preferred to heat the film to a temperature of greater than 350° C., most preferably, greater than 400° C. for 15 to 400 seconds. During this drying and converting process, the film is restrained from undue shrinking and, in fact, can be stretched by as much as 200% of its initial dimension prior to completion of the drying and conversion. Stretching can be in any direction. In film manufacture, stretching can be in either the longitudinal direction or the transverse direction. If desired, restraint can also be provided to permit some limited degree of shrinkage.

A "solvated film" of the poly(amic acid) is a film which is all poly(amic acid) or which has only a low polyimide content, for example 0 to 25%, and which is about 50 to 75% by weight polymer and 25 to 50% by weight solvent. Such film is sufficiently strong to be self-supporting.

The solvated poly(amic acid) can be prepared by casting the poly(amic acid) solution on a casting surface and heating at a temperature above 50° C. to partially convert the poly(amic acid) to polyimide. The extent of poly(amic acid) conversion depends on the temperature employed and the time of exposure, but, generally about 25 to 95% of the amic acid groups are converted to imide groups. The partially converted poly(amic acid) is then thermally converted to the polyimide by heating at temperatures above 350° C., preferably above 400° C.

The polyimide film contains from 0.02 to 1% by weight of tin based on the weight of the final cured polyimide film. When amounts of tin less than 0.02% are used, little improvement in adhesive properties of the polyimide film is obtained. Moreover, if the tin concentration exceeds 1% by weight, the properties of the polyimide film may be compromised. A preferred amount of tin present in the polyimide film ranges from 0.02 to 0.7% by weight and, most preferably, from 0.05 to 0.50% by weight.

Although not wishing to be bound by any specific theory, it is believed that the incorporation of the hydrocarbyl tin compound into the polyimide film improves adhesion after temperature humidity aging through three different mechanisms. Firstly, the cohesive strength of the polyimide film is increased through additional crosslinking sites provided by the hydrocarbyl tin compound. The bonds between the organic and tin moieties are broken at the high temperatures used to cure the polyimide film. The organic moieties are vaporized and the remaining tin centers either form coordination complexes with different polyimide chains and/or catalyze an interchain condensation leading to a crosslinked structure which increases the molecular weight and strength of the polyimide film. Accordingly, a temperature greater than 350° C., preferably greater than 400° C. is necessary to obtain the catalyst activation and achieve the desired strength improvement. Secondly, the tin centers also segregate to the near surface region of the polyimide film at the high temperatures used for curing. The resulting compositional gradient is believed to produce a gradient in the physical and mechanical properties of the film (e.g. modulus, glass transition temperature, thermal expansion etc.) which reduces the abrupt variation of these properties that normally occurs between the tin and the polyimide interface. Finally, the tin centers in the near surface region act as sources for the formation of either alloys or intermetallic compounds with the metal deposited onto the polyimide film, especially under higher temperature conditions where the metal diffuses into the polyimide film.

Any hydrocarbyl tin compound in oxidation states (II) or (IV) such as:
dibutyltin diacetate
dibutyltin dilaurate
bis (tributyltin) oxide
tributyltin acetate
tetrabutyltin
tetraphenyltin
tributyltin chloride
dibutyltin chloride
can be incorporated into the polyimide film.

Different hydrocarbyl tin compounds, which have different characteristics and properties due to the different organic moieties, may be used. For example, a hydrocarbyl tin compound having an organic moiety generated by-product can be selected which is inert or compatible with the process environment, or a liquid, e.g. bis(tributyltin)oxide can be used instead of a powder, e.g. tributyltin acetate. Furthermore, different hydrocarbyl tin compounds can have different reaction characteristics when incorporated into the poly(amic acid) solution. Dibutyltin diacetate accelerates the gelation rate of the poly(amic acid) and reduces the processing time, whereas bis(tributyltin)oxide or tetrabutyl tin do not affect the processing characteristics of the poly(amic acid) solution and may be added either prior to or during the poly(amic acid) polymerization.

A particularly preferred hydrocarbyl tin compound is bis(tributyltin)oxide which when used in a concentration range of from 0.2 to 0.7 weight % provides a peel strength after temperature humidity aging of at least 4.5 pli when the polyimide fill is directly bonded to a metal vacuum deposited layer.

The polyimide film can additionally contain small amounts of fine particulate fillers to impart slip and handling or other desirable properties to the film. Such particulate fillers include, but are not limited to, silica, alumina, silicates, calcium phosphates and the like. Calcium hydrogen phosphate is a particularly preferred particulate filler and when used in an amount of from 100 to 2000 ppm provides advantageous slip properties to the polyimide film.

The polyimide film can have any thickness suitable for use as a substrate for electronic circuitry, and most generally is in the form of a relatively thin film having a thickness of between about 10 and 125 micrometers.

According to the process for preparing the metallized polyimide film, a metal, such as a noble metal, alkaline earth metal, or transition metal (e.g. copper, cobalt, nickel, chromium, titanium) is vacuum deposited by an evaporative deposition method or the sputtering method on the surface of the polyimide film containing the hydrocarbyl tin compound to form a thin metal layer. The vacuum deposited metal layer is preferably a homogeneous layer having a thickness of about 500 to 5000 Angstroms, more preferably about 1000 to 2000 Angstroms.

In the above vacuum deposition method, the vacuum pressure preferably ranges from $1 \times 10^{-10}$ to $5 \times 10^{-2}$ Torr and the deposition temperature ranges from 20° C. to 200° C.

Among the above methods that can be used, the DC or RF Magnetron sputtering methods are particularly preferred and, preferably, the vacuum pressure used during sputter deposition can range from $1 \times 10^{-3}$ to $8 \times 10^{-2}$ Torr and the sputter deposition temperature can range from 20° C. to 200° C.

A metal plated layer is subsequently applied to the thin vacuum deposited metal layer by an electroplating method to thereby form a thick metal plated layer and thus provide a metallized polyimide film.

The thick metal plated layer may be, for example, a layer of a metal such as copper, nickel, chromium, zinc, cadmium, tin, lead, gold, silver, cobalt, palladium, platinum, aluminum and can have a thickness ranging from 10 to 70 micrometers, preferably from 15 to 35 micrometers.

An electroplating method can be used wherein the film article to be plated is dipped as the cathode into a solution containing metal ions, an anode is dipped opposite thereto and a direct current is passed therebetween to form a metal coated layer.

As metal electroplating conditions, the plating bath preferably contains copper sulfate, sulfuric acid, chloride ion, and brightener and the plating conditions are, preferably, a temperature of 20° C. to 25° C. and a current density of 10 amps/ft$^2$. Prior to electroplating, the vacuum deposited layer can be cleaned with VersaCLEAN® 470 precleaner.

Another useful metal layer forming method that can be used in the formation of the metallized polyimide film involves first forming a tie-coat layer of metal such as chromium, nickel, or titanium on the polyimide film surface. Such tie-coat layers can have thicknesses ranging from 10 to 300 Angstroms and aid in bonding the metal vacuum deposited layer to the polyimide film.

An improvement in peel strength can also be obtained by treating the polyimide film in a gas plasma prior to vacuum deposition of the metal on the surface of the polyimide. A gas plasma is formed by the interaction of a gas with an electrical field. For example, an electrical field may be provided by a RF generator which provides the necessary field for interaction with a gas to produce radical species primarily by electron-induced dissociation. These species then interact with the outermost atomic layers of the polyimide film, whereby a stronger bond with the subsequently vacuum deposited metal can be achieved.

Examples of gases which can be used to form the gas plasma include inert gases such as helium, argon, krypton, xenon, neon, radon, nitrogen, etc., as well as other gases such as oxygen, air, carbon monoxide, carbon dioxide, carbon tetrachloride, chloroform, hydrogen, etc., fluorinated gases (commonly known as Freons®) including carbon tetrafluoride, dichlorodifluoron ethane, trifluorochloromethane, trichlorofluoromethane as well as mixtures of the aforesaid gases. Preferred gases include oxygen and argon and blends of oxygen and argon.

The pressure of the gas in the plasma atmosphere should be in the range from $1\times10^{-3}$ to $5\times10^{-1}$ Torr or, preferably, from $1\times10^{-2}$ to $8\times10^{-2}$ Torr, and the temperature may range from ambient (20° C. to 25° C.) up to the glass transition or melting temperature of the polyimide polymer. The electric power can be supplied from various sources such as by direct current, alternating current, audio frequency, intermediate frequency, microwave frequency, etc. The power density employed is the electric power per unit area and ranges from 10 to 500 mW/cm$^2$. The treatment of the polyimide film with a gas plasma is effected for a period of time ranging from about 5 seconds up to about 30 minutes or more in duration, the time of treatment depending upon the other operating conditions including temperature, pressure and power density. The vacuum deposition of metal on the surface of the polyimide film can be effected immediately after the gas plasma treatment.

In general, metallized polyimide films which are formed by plating a metal onto a plasma treated vacuum metallized polyimide film have good initial adhesion for many applications. The peel strength of many such metallized polyimide films currently in use is generally insufficient for many end uses because any delamination can cause the failure of the metallized film to operate in its intended use. However, even the peel strength currently achievable in many metallized polyimide films can be decreased by exposure of the metallized polyimide film to processing chemicals (e.g. etchants, cleaners, coatings, etc.) and environmental stress (e.g. humidity) and can be reduced to less than 4 pounds per inch and, in some cases, to less than 2 pounds per inch. As a result, conventional metallized polyimide films, due to low peel strengths after environmental testing, can fail to function satisfactorily in circuit assemblies on printed wiring boards.

The metallized polyimide film of the invention has a metal plated layer and a polyimide film layer, containing an adhesion-enhancing amount of a hydrocarbyl tin compound in oxidation states (II) or (IV), bonded directly and integrally with a high bonding strength after accelerated aging, without an adhesive layer, through a metal vacuum deposited layer and can advantageously be used as a two layer clad for making printed circuits. The peel strength after temperature humidity aging of the metallized polyimide film can be greater than about 4.5 pounds per inch and can be in excess of 7 pounds per inch.

The advantageous properties of this invention can be observed by reference to the following examples which illustrate, but do not limit, the invention.

EXAMPLES 1 to 3

(Comparative Examples 1A to 3A)

Pyromellitic dianhydride was added to a solution of 4,4'-diaminodiphenyl ether in N,N-dimethylacetamide until the solution viscosity was 2000 to 3000 poises and the percent solids was approximately 20%. The resulting poly (amic acid) solution was cooled and, prior to casting, mixed with excess molar quantities of acetic anhydride and 3-methyl pyridine. Bis(tributyltin)oxide (1200 ppm) was added to Examples 1 to 3 as a 2% solution in N,N-dimethylacetamide, whereas no bis(tributyltin)oxide was added to Comparative Examples 1A to 3A. Polyimide films containing tin are designated as HZT and Comparative films are designated as H. The poly(amic acid) solution was cast onto a heated surface and fastened at the edges to a tenter chain and transported through an oven to dry the film and complete the imidization. A temperature of at least 400° C. was used in the oven to produce the final cured polyimide film.

The polyimide films of Examples 1 and 2 and Comparative Examples 1A and 2A were cut into approximately 12 inch squares and rinsed with Freon®. The samples were placed in a Leybold L560 electron beam evaporator. A vacuum deposited layer of copper having a thickness of approximately 2000 Angstroms was then formed directly on the surface of the polyimide films using electron beam heating. The vacuum deposition was conducted at a pressure of $2.2\times10^{-6}$ Torr.

When plasma treatment was used prior to vacuum metal deposition (Example 2 and Comparative Example 2A), gas was first introduced into the chamber to a pressure of $6\times10^{-2}$ Torr. The plasma treatment was conducted at an estimated power density of 160–200 mW/cm$^2$. Plasma etching was conducted for 10 minutes, the voltage was turned off, the dosing valve closed and the chamber pumped down to $2.2\times10^{-6}$ Torr.

A thick (35 micrometers) copper plated layer was then formed on the vacuum deposited layer of the polyimide film. The copper plating was conducted using a Copper Pro® 250 plating bath (from E. I. dupont de Nemours and Co.) comprising copper sulfate, sulfuric acid, chloride ion and brighteners at a current density of 10 amps/ft$^2$.

The metallized polyimide films were then aged for 500 hours at 85° C. and 85% relative humidity. The peel strength of the metal plated films after 500 hours was determined according to IPC Test Method 2.4.9, Revision C, using 0.5 inch wide strips.

The polyimide films of Examples 3 and Comparative Example 3A were cut into approximately 1.75 inch squares and rinsed with Freon®. The samples were placed in a Balzers BNAE080-T thin film deposition chamber. A vacuum deposited layer of copper having a thickness of approximately 2000 Angstroms was then formed directly on the surface of the polyimide films using a resistive heating means. The vacuum deposition was conducted at a pressure of 1 to $3 \times 10^{-6}$ Torr for such time until the thickness of the vacuum deposited copper layer was 2000 Angstroms.

Plasma treatment was used prior to vacuum metal deposition, and gas was first introduced into the chamber by a gas dosing valve to a pressure of 5 to $7 \times 10^{-2}$ Torr. The plasma was then started using a voltage of from 100 to 250 volts at 2 ma corresponding to a power density of from 10 to 25 $mW/cm^2$. Plasma etching was performed for 5 minutes, the voltage was turned off, the dosing valve closed and the chamber pumped down to 1 to $3 \times 10^{-6}$ Torr.

The copper plating step was the same as for Examples 1 and 2 and Comparative Examples 1A and 2A. Aging at 85° C./85% relative humidity was performed in a temperature/humidity chamber and peel testing, because of the small sample size, was a modification of IPC Test Method 2.4.9, Revision C. The 0.5 inch wide strips were pulled at a crosshead speed of 0.5 inch per minute over a distance of 0.75 inch with calculation of the peel value over the last 0.5 inch.

The peel values for Examples 1 to 3 and Comparative Examples 1A to 3A are summarized in Table I.

TABLE I

| Example No. | Polyimide Film Type[1] Thickness (μm) | Organotin Additive[2] | Metal Evaporated[3] |
|---|---|---|---|
| 1 | HZT (50) | Yes | Cu |
| 1A | H (75) | No | Cu |
| 2 | HZT (50) | Yes | Cu |
| 2A | H (75) | No | Cu |
| 3 | HZT (50) | Yes | Cu |
| 3A | H (75) | No | Cu |

| Example No. | Plasma Treatment | 500 Hrs @ 85° C./85% RH Peel Strength (pli)[4] |
|---|---|---|
| 1 | None | 5.22 |
| 1A | None | 1.84 |
| 2 | Argon | 6.57 |
| 2A | Argon | 2.69 |
| 3 | Oxygen | 5.22 |
| 3A | Oxygen | 1.70 |

[1]H = pyromellitic dianhydride, 4,4'-diaminodiphenyl ether
[2]Contains 1200 ppm bis(tributyltin)oxide
[3]2000 Angstroms
[4]Examples 3 and 3A based on 0.5 inch pull EXAMPLES 4 to 6

(Comparative Examples 4A to 6A)

The polyimide films of Examples 4 to 6 were made in the same manner as Examples 1 to 3, except that finely divided particles of calcium hydrogen phosphate (1200 to 1500 ppm) were added to provide slip properties to the final film. The polyimide films of Comparative Examples 4A to 6A were also made in the same manner as Comparative Examples 1A to 3A, except that finely divided particles of calcium hydrogen phosphate (1200 to 1500 ppm) were added to provide slip properties to the final film. Polyimide films containing tin and slip additive are designated HNZT and Comparative slip additive containing films are designated HN. The plasma treating conditions and vacuum copper deposition used in Examples 4 to 6 and Comparative Examples 4A to 6A are the same as those used in Example 3 and Comparative Example 3A. A thin (10 Angstroms) or thick (300 Angstroms) layer of chromium was evaporatively deposited prior to vacuum copper deposition. The vacuum deposited metallized polyimide films were plated to a thickness of 35 μm with copper, temperature/humidity aged for 500 hours and peel tested the same as for Example 3 and Comparative Example 3A. All of the tin containing polyimide films broke while trying to start a peel indicating a peel strength of 6 pli or greater. The peel strength results are summarized in Table II.

TABLE II

| Example No. | Polyimide Film Type[1] Thickness (μm) | Organotin Additive[2] | Metal Evaporated | Chromium Tie Layer[4] |
|---|---|---|---|---|
| 4 | HNZT (75) | Yes | Cu | 300 |
| 4A | HN (75) | No | Cu | 300 |
| 5 | HNZT (75) | Yes | Cu | 10/Air[5] |
| 5A | HN (75) | No | cu | 10/Air[5] |
| 6 | HNZT (75) | Yes | cu | 10 |
| 6A | HN (75) | No | Cu | 10 |

| Example No. | Plasma Treatment | 500 Hrs @ 85° C./85% RH Peel Strengths[6] |
|---|---|---|
| 4 | Argon/Oxygen | KB[7] |
| 4A | Argon/Oxygen | 1.41 |
| 5 | None | KB[7] |
| 5A | None | 0.59 |
| 6 | Argon/Oxygen | KB[7] |
| 6A | Argon/Oxygen | 2.42 |

[1]HN = Pyromellitic dianhydride, 4,4'-diaminodiphenyl ether containing 1200 to 1500 ppm calcium hydrogen phosphate
[2]Contains 1200 ppm bis(tributyltin)oxide
[3]2000 Angstroms
[4]Thickness of chromium tie layer in Angstroms
[5]Exposed to ambient conditions of 20–25° C. for 7 days after chromium deposition
[6]Examples 4, 4A, 5, 5A, 6 and 6A based on 0.5 inch pull
[7]KB = film broke trying to start peel EXAMPLES 7 to 10

(Comparative Examples 7A to 10A)

The polyimide films of Examples 7 to 10 and Comparative Examples 7A to 10A contained 40% 3,3',4,4'-biphenyltetracarboxylic dianhydride, 60% pyromellitic dianhydride, 60% p-phenylenediamine and 40% 4,4'-diaminodiphenyl ether. Poly(amic acid)s of approximately 15% solids and 2000 to 3000 poises were converted, dried and cured in a manner similar to Examples 1 to 3 and Comparative Examples 1A to 3A. The amount of bis (tributyltin)oxide used in Examples 7 to 10 was 3500 ppm and was added as a 2% solution in N,N-dimethylaceteamide. The Examples containing tin are designated as EZT and the Comparative Examples are designated as E. Example 7 and Comparative Example 7A were metallized, aged and peel tested using the same conditions used for Examples 1 and 2 and Comparative Examples 1A and 2A. Examples 8 and 9 and Comparative Examples 8A and 9A were metallized, aged and peel tested using the same conditions used for Example 3 and Comparative Example 3A. The vacuum metallization used in Example 10 and Comparative Example 10A was sputter deposition. The films were plasma etched at $1.6\times10^{-2}$ Torr and a power density of 150 to 160 mW/cm$^2$ for 10 minutes. The chromium was sputter deposited at a pressure of $1.3\times10^{-2}$ Torr at 50 Angstroms/minute using a power of 650 watts. The copper was sputter deposited at a pressure of $1.3\times10^{-2}$ Torr at 1000 Angstroms/minute using 5 Kw for 2 minutes. The vacuum deposited samples were plated, aged and peel tested in the same manner as Examples 1 and 2 and Comparative Examples 1A and 2A. The peel values are given in Table III.

TABLE III

| Example No. | Polyimide Film Type[1] Thickness (μm) | Organotin Additive[2] | Metal Evaporated[3] |
|---|---|---|---|
| 7 | EZT (50) | Yes | Cu |
| 7A | E (50) | No | Cu |
| 8 | EZT (50) | Yes | Cu |
| 8A | E (50) | No | Cu |
| 9 | EZT (50) | Yes | Cu |
| 9A | E (50) | No | Cu |
| 10 | EZT (50) | Yes | Cr/Cu[4] |
| 10A | E (50) | No | Cr/Cu[4] |

| Example No. | Plasma Treatment | 500 Hrs[5] @ 85° C./85% RH Peel Strength (pli)[6] |
|---|---|---|
| 7 | None | 5.45 |
| 7A | None | 3.25 |
| 8 | Argon | 6.47 |
| 8A | Argon | 4.15 |
| 9 | Oxygen | 7.00 |
| 9A | Oxygen | 3.20 |
| 10 | Argon | 4.77 |
| 10A | Argon | 2.13 |

[1]E = 3,3',4,4'-biphenyltetracarboxylic dianhydride, pyromellitic dianhydride, p-phenylenediamine, 4,4'-diaminodiphenyl ether.
[2]Contains 3500 ppm bis(tributyltin)oxide
[3]2000 Angstroms Cu.
[4]Examples 10 and 10A sputter deposited metal consisting of 150 Angstroms chromium followed by 2000 Angstroms of copper.
[5]Examples 10 and 10A temperature/humidity aged for 250 hrs.
[6]Examples 8, 8A, 9 and 9A based on 0.5 inch pull.

What is claimed is:

1. A process for preparing a metallized polyimide film, comprising the steps of:

(a) incorporating a hydrocarbyl tin compound in oxidation states (II) or (IV) into a solution of a poly(amic acid) precursor of a polyimide film;

(b) forming a solidified self-supporting film of said poly (amic acid) precursor;

(c) heating said solidified poly(amic acid) film at a temperature greater than 350° C. to completely imidize said poly(amic acid) to form said polyimide film, wherein the concentration of tin in said completely imidized polyimide film ranges from 0.05 to 0.50% by weight;

(d) forming a vacuum deposited metal layer having a thickness of from 500 to 5000 angstroms by vacuum deposition of a metal on at least one side of said polyimide film; and (e) applying an electroplated layer having a thickness of from 10 to 70 micrometers onto said vacuum deposited metal layer, wherein said polyimide base layer is directly bonded to said vacuum deposited metal layer without the use of an adhesive.

2. The process of claim 1 wherein the polyimide film comprises pyromellitic dianhydride and 4,4'-diaminodiphenyl ether.

3. The process of claim 1 wherein the polyimide film comprises 3,3',4,4'-biphenyltetracarboxylic dianhydride, pyromellitic dianhydride, p-phenylene diamine and 4,4'-diaminodiphenyl ether.

4. The process of claim 1 wherein the hydrocarbyl tin compound comprises bis(tributyltin)oxide.

5. The process of claim 1 wherein the thickness of said vacuum deposited metal layer ranges from 500 to 5000 Angstroms and the thickness of said electroplated layer ranges from 10 to 70 micrometers.

6. The process of claim 5 wherein said vacuum deposited metal layer and said electroplated layer comprise copper.

7. The process of claim 1 wherein a layer of chromium is formed on said polyimide film prior to forming said vacuum deposited metal layer in step (d).

8. The process of claim 1 wherein the polyimide film from step (c) is treated with a gas plasma prior to forming said vacuum deposited metal layer in step (d).

9. The process of claim 8 wherein the gas comprises argon, oxygen or mixtures of argon and oxygen.

* * * * *